(12) United States Patent
Lifka et al.

(10) Patent No.: US 8,994,044 B2
(45) Date of Patent: Mar. 31, 2015

(54) ELECTRO-OPTICAL DEVICE, ELECTRODE THEREFORE, AND METHOD AND APPARATUS OF MANUFACTURING AN ELECTRODE AND THE ELECTRO-OPTICAL DEVICE PROVIDED THEREWITH

(75) Inventors: Herbert Lifka, Son en Breugel (NL); Antonius Maria Bernardus van Mol, Eindhoven (NL)

(73) Assignees: Nederlandse Organisatie voor Toegepast—Natuurwetenschappelijk Onderzoek TNO, Delft (NL); Koninklijke Philips Electronics N.V., Eindhoven (NL)

( * ) Notice: Subject to any disclaimer, the term of this patent is extended or adjusted under 35 U.S.C. 154(b) by 101 days.

(21) Appl. No.: 13/514,748

(22) PCT Filed: Nov. 30, 2010

(86) PCT No.: PCT/NL2010/050802
§ 371 (c)(1),
(2), (4) Date: Jun. 29, 2012

(87) PCT Pub. No.: WO2011/071372
PCT Pub. Date: Jun. 16, 2011

(65) Prior Publication Data
US 2012/0299050 A1    Nov. 29, 2012

(30) Foreign Application Priority Data
Dec. 11, 2009 (EP) .................................. 09178853

(51) Int. Cl.
*H01L 27/14*     (2006.01)
*H01L 51/44*     (2006.01)
*H01L 51/52*     (2006.01)

(52) U.S. Cl.
CPC .......... *H01L 51/441* (2013.01); *H01L 51/5203* (2013.01); *Y02E 10/549* (2013.01)
USPC ................................. 257/91; 257/99; 349/111

(58) Field of Classification Search
USPC ................ 257/91, 99; 349/111; 178/322, 389
See application file for complete search history.

(56) References Cited

U.S. PATENT DOCUMENTS

| | | | |
|---|---|---|---|
| 5,293,546 | A | 3/1994 | Tadros et al. |
| 7,011,983 | B2 | 3/2006 | Foust et al. |
| 7,638,807 | B2 * | 12/2009 | Yukinobu ........................ 257/88 |
| 7,854,513 | B2 * | 12/2010 | Quach ............................ 353/20 |
| 2002/0130605 | A1 | 9/2002 | Mueller et al. |

(Continued)

FOREIGN PATENT DOCUMENTS

| | | |
|---|---|---|
| JP | 9092469 | 4/1997 |
| JP | 2004207236 | 7/2004 |

(Continued)

*Primary Examiner* — Michael Shingleton
(74) *Attorney, Agent, or Firm* — Preti Flaherty Beliveau & Pachios LLP

(57) ABSTRACT

The present invention relates to an electro-optical device provided with an electrode (10). The electrode comprising an electrically conductive structure extending in a plane. The structure comprises a grid of elongated elements (12) with length L and a width dimension D in said plane. The electrically conductive structure further comprises one or more contactfields (14) having an inscribed circle with a radius of at least 2D and a circumscribed circle with a radius of at most three times L. The area occupied by the contactfields (14) is at most 20% of the area occupied by the grid of elongated elements (12).

13 Claims, 8 Drawing Sheets

(56) References Cited

U.S. PATENT DOCUMENTS

| | | |
|---|---|---|
| 2004/0121508 A1 | 6/2004 | Foust et al. |
| 2005/0242721 A1 | 11/2005 | Foust et al. |
| 2005/0253508 A1 | 11/2005 | Okano |
| 2005/0258436 A1 | 11/2005 | Arai |
| 2006/0180807 A1 | 8/2006 | Bechtel et al. |
| 2007/0013293 A1 | 1/2007 | Cok |
| 2007/0096112 A1 | 5/2007 | Hoshi |
| 2007/0273276 A1 | 11/2007 | Ottermann et al. |
| 2008/0157661 A1 | 7/2008 | Kajikawa et al. |
| 2008/0251808 A1 | 10/2008 | Kususe et al. |
| 2009/0096371 A1 | 4/2009 | Matsudate et al. |
| 2009/0166877 A1 | 7/2009 | Lifka et al. |

FOREIGN PATENT DOCUMENTS

| | | |
|---|---|---|
| JP | 2006237574 | 9/2006 |
| JP | 2007123390 | 5/2007 |
| WO | WO2006/064443 | 6/2006 |
| WO | WO2008/026649 | 3/2008 |
| WO | WO2008/126267 | 10/2008 |
| WO | WO2008/135902 | 11/2008 |
| WO | WO2009/001241 | 12/2008 |
| WO | WO2009/004560 | 1/2009 |
| WO | WO2009/007899 | 1/2009 |

* cited by examiner

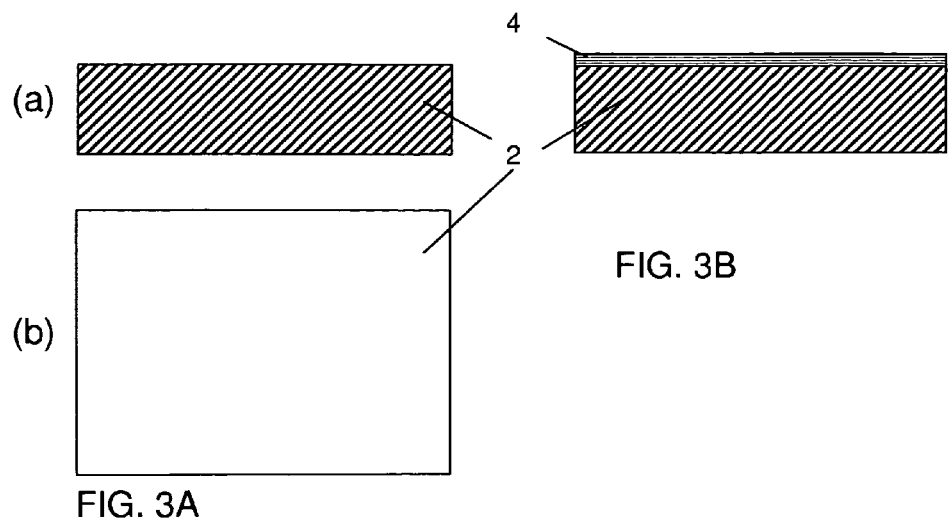
FIG. 3B
FIG. 3A
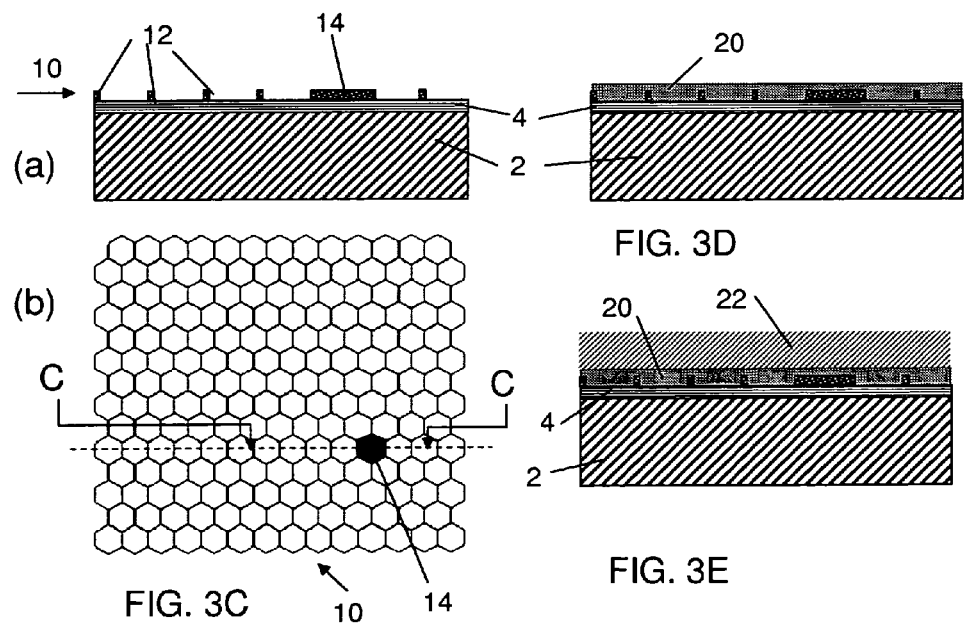
FIG. 3D
FIG. 3C
FIG. 3E

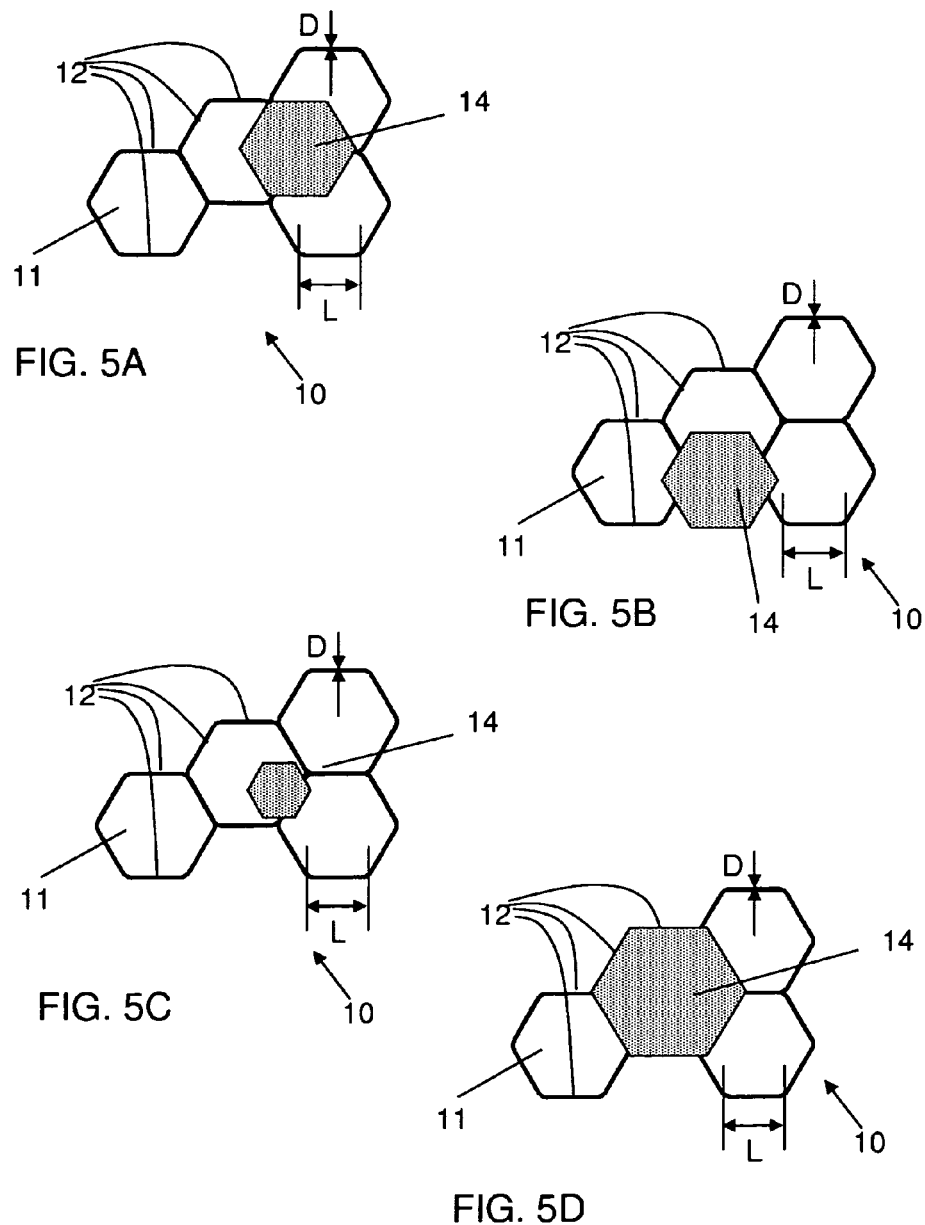

ELECTRO-OPTICAL DEVICE, ELECTRODE THEREFORE, AND METHOD AND APPARATUS OF MANUFACTURING AN ELECTRODE AND THE ELECTRO-OPTICAL DEVICE PROVIDED THEREWITH

BACKGROUND OF THE INVENTION

1. Field of the Invention

The present invention relates to an electrode for an electro-optical device.

The present invention further relates to an electro-optical device provided with such an electrode.

The present invention further relates to a method of manufacturing such an electrode.

The present invention further relates to a method of manufacturing an electro-optical device provided with such an electrode.

The present invention further relates to a device for manufacturing such an electrode.

The present invention further relates to an apparatus for manufacturing an electro-optical device provided with such an electrode.

2. Related Art

An electro-optical device is a device that provides for an optical effect in response to an electric signal, or that generates an electric signal in response to an optical stimulus. Examples of the first are light emitting diodes, such as organic light emitting diodes and electro chromic devices. Examples of the second are photo voltaic cells.

For large area OLED lighting on flexible plastic substrates, a large current is required to drive the system. The present thin film materials used for the anode (e.g. ITO) and cathode (e.g. Ba/Al) have a large resistivity and the large currents give rise to substantial voltage drop, which determine a non-uniform light emission. For producing large area flexible OLED devices on plastic substrates there is a need for an additional metallization structure to support one or both electrodes. For reducing the manufacturing costs, such structured metallization coatings will preferably be applied on rolls of plastic foil using an inline roll-to-roll web coating process.

Accordingly, for electro-optical devices, such as light emitting devices and electro-chromic devices, but also for photo-voltaic products there is a need for a metallization structure that on the one hand has a good electrical conductivity, while on the other hand has a high transmission for photon radiation.

An electrode for an electro-optical device is disclosed in US-patent application 2002130605A. Light is enabled to pass through this electrode which comprises a pattern of conductive elements. The elements have dimensions small compared to the wavelength of light, so that the electrode appears transparent. The light intensity distribution after having penetrated the electrode compared with the light intensity distribution before having penetrated the electrode is influenced by forward scattering.

It is not described in the cited US-patent application how the electrode is connected to an external power line. Usually this is realized by a bus-bar which is connected to the edges of the electrode. However, the bus-bar should be applied before the final product using the electrode is completed. Accordingly, the dimensions of the bus-bar should be known in advance. It is desired to provide an electrode and an electro-optical product provided with such an electrode that can be manufactured in arbitrary dimensions.

SUMMARY OF THE INVENTION

It is a purpose of the invention to provide an improved electro-optical device.

It is a further purpose of the invention to provide an improved method of manufacturing an electro-optical device.

It is a still further purpose of the invention to provide an apparatus for manufacturing an electro-optical device.

According to a first aspect of the invention there is provided an electro-optical device comprising a first electrode (10) and a second electrode (26) and an electro-optical layer (24), wherein the electro-optical layer is arranged between the first and the second electrode, and wherein at least the first electrode comprises an electrically conductive structure extending in a plane, the structure comprising a grid of elongated elements with length L and a width dimension D in said plane, the electrically conductive structure further comprising one or more contactfields having an inscribed circle with a radius of at least 2D and an circumscribed circle with a radius of at most three times L and wherein the area occupied by the contactfields is at most 20% of the area occupied by the grid of elongated elements.

The inscribed circle of a contactfield is defined here as the largest circle that fits within the contactfield. The circumscribed circle is the smallest circle that encloses the contact field.

It is noted that US2008/251808 describes a nitride semiconductor light-emitting device that includes a layered portion emitting light on a substrate. The layered portion includes an n-type semiconductor layer, an active layer, and a p-type semiconductor layer. The periphery of the layered portion is inclined, and the surface of the n-type semiconductor layer is exposed at the periphery. An n electrode is disposed on the exposed surface of the n-type semiconductor layer. The cited US document teaches that the layered portions 10, that serve to generate the light, have an inclined periphery. The electrode 12 having the maze-like structure likewise has inclined portions that are applied against the inclined periphery of the layered portions 10. According to this US document the ohmic contact of the n electrode is established on the surface of the n-type contact layer exposed at the inclined periphery, thus preventing the n-type contact layer from transmitting light. Hence, accordingly to the cited US-document it is essential that the maze-like structure is applied at the same level as the layered portions to achieve this effect as is consistently shown in each of the embodiments disclosed therein.

In view thereof the teaching of this US-document is not applicable to the electro-optical device as disclosed in the US-patent application 2002130605A for which it is necessary that the light-emitting material is arranged behind the electrodes to achieve that the light intensity distribution is influenced by forward scattering.

Depending on the application the second electrode in the device according to the present invention may also comprise an electrically conductive structure as described above. This is favorable if it is desired that also the second electrode is transparent. Alternatively, if this is not desired, a continuous electrode may be used, such as a metal foil.

According to a second aspect of the invention there is provided a method of manufacturing an electro-optical device, comprising manufacturing an electrode for an electro-optical device, comprising the steps of providing a carrier, applying an electrically conductive structure extending in a plane at a surface of the carrier, the structure comprising a grid of elongated elements with length L and a width dimension D in said plane, the structure further comprising one or more contactfields having an inscribed circle with a radius of at least 2D and an circumscribed circle with a radius of at most three times L and wherein the area occupied by the contact-fields is at most 20% of the area occupied by the grid of elongated elements,
the method further comprising the steps of
  applying an electro-optical layer at the electrode.
  applying a second electrode at a side of the electro-optical layer opposite the electrode formed by the electrically conductive structure,
  providing an externally accessible electrical connection that extends to at least one of the one or more contact fields.
According to a fifth aspect of the invention there is provided an apparatus for manufacturing an electro-optical device, the apparatus comprising a device for manufacturing an electrode for an electro-optical device comprising a facility that is controlled to apply an electrically conductive structure extending in a plane at a surface of a carrier, the structure comprising a grid of elongated elements with length L and a width dimension D in said plane, the structure further comprising one or more contactfields having an inscribed circle with a radius of at least 2D and an circumscribed circle with a radius of at most three times L and wherein the area occupied by the contactfields is at most 20% of the area occupied by the grid of elongated elements, the apparatus further comprising a device for applying an electro-optical layer and a device for applying a second electrode.

The measures according to the present invention make it possible to provide for a reliable electric connection to the grid shaped electrode in a device that is separated according an arbitrary cutting line from a semifinished product. The invention is in particular applicable to organic electro-optical devices, such as an OLEDs, as these electro-optical device comprise a barrier structure to shield the device internally from moisture in the environment.

BRIEF DESCRIPTION OF THE DRAWINGS

These and other aspects are described in more detail with reference to the drawing. Therein:
FIG. 3A to 3I show a first to a ninth step of a method according to the second aspect of the invention,
FIG. 5A to 5D shows alternative embodiments for an electrode of an electro-optical device according to the first aspect of the invention.

DETAILED DESCRIPTION OF EMBODIMENTS

Figure 1:
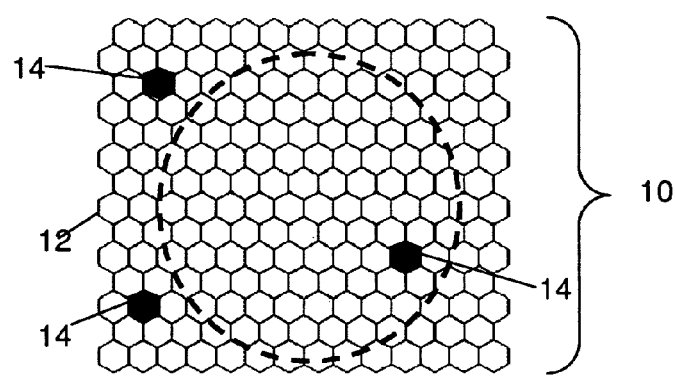
FIG. 1 shows an electrode for an electro-optical device according to the first aspect of the invention.

In the following detailed description numerous specific details are set forth in order to provide a thorough understanding of the present invention. However, it will be understood by one skilled in the art that the present invention may be practiced without these specific details. In other instances, well known methods, procedures, and components have not been described in detail so as not to obscure aspects of the present invention.

In the drawings, the size and relative sizes of layers and regions may be exaggerated for clarity.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. All publications, patent applications, patents, and other references mentioned herein are incorporated by reference in their entirety. In case of conflict, the present specification, including definitions, will control. In addition, the materials, methods, and examples are illustrative only and not intended to be limiting.

Like numbers refer to like elements throughout.

Figure 1A:
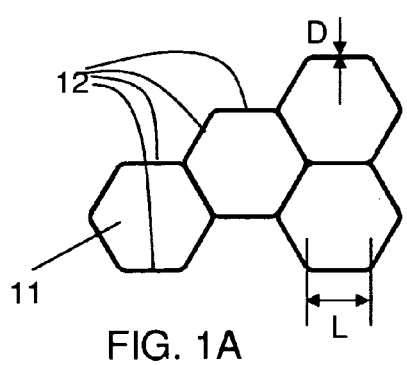
FIG. 1A shows a first detail of the electrode of FIG. 1.

FIG. 1 shows an electrode 10 for an electro-optical device. The electrode 10 comprises an electrically conductive structure extending in a plane, in FIG. 1 coinciding with the plane of the drawing. As shown in FIG. 1A, an enlarged portion of FIG. 1, the electrically conductive structure comprises a grid of elongated elements 12 with length L and a width dimension D in said plane. The elongated elements 12 enclose openings 11. In the embodiment shown the length L equals about 1 mm. However another value for the length L may be selected for example in the interval of 0.5 to 5 mm. Nevertheless, for some applications the length L may be significantly higher. For example, for very large area OLEDs, wherein a well conducting layer is present between the electrically conductive structure and the electro-optical device, the elements of the electrically conductive structure may have a length as large as 10 cm. Such a well conducting layer may be for example a hole injection layer or an electron injection layer that additionally has a good lateral conductivity. The width D of the elements 5 is about 50 µm. However, depending on the application, another value for the width D may be selected for example in the interval of 1 to 500 µm.

Figure 1B:
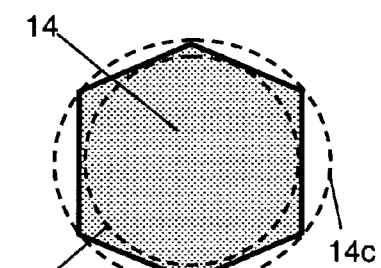
FIG. 1B shows a second detail of the electrode of FIG. 1.

The electrode 10 further comprises a plurality of contactfields 14, one thereof shown enlarged in FIG. 1B. The contact field 14 shown has an inscribed circle 14i with a radius of at least twice the width D of the elongated elements 12 and a circumscribed circle 14c with a radius of at most three times the length L of the elongated elements 12. In this embodiment the inscribed circle 14*i* has a radius of $\frac{1}{2}\sqrt{3} \cdot L \approx 0.87$ mm, which is more than two times larger than the width D, 50 µm, of the elongated elements 12. The circumscribed circle 14*c* has a radius equal to L, which is less than three times the length L of the elongated elements 12.

The surface occupied by the contactfields 14 is at most 20% of the area occupied by the grid of elongated elements 12.

The grid formed by the elongated elements 12 leaves hexagonal openings allowing photon radiation to pass. Each elongated element 12 bounds two openings. Accordingly, the area occupied by the elongated elements 12 for each opening is $\frac{1}{2} \times 6 \times 50$ µm$\times 1$ mm=0.15 mm$^2$.

The area occupied by a contact field 14 is 2.5 mm$^2$. For the present embodiment the area occupied by the contactfields 14 is not more than 20% of the area occupied by the grid of elongated elements 4 if at most 1 in 100 openings in the electrically conductive structure is replaced by a contact field 14. In a practical embodiment of the electrode 10 contactfields 14 are arranged each 3 cm in both directions.

In the embodiment of the electrode 10 shown in FIG. 1, it can be seen that the contactfields 14 are each connected to at least 5 elongated elements 12, in this the contactfields 14 each are connected to 6 elements.

Figure 2:
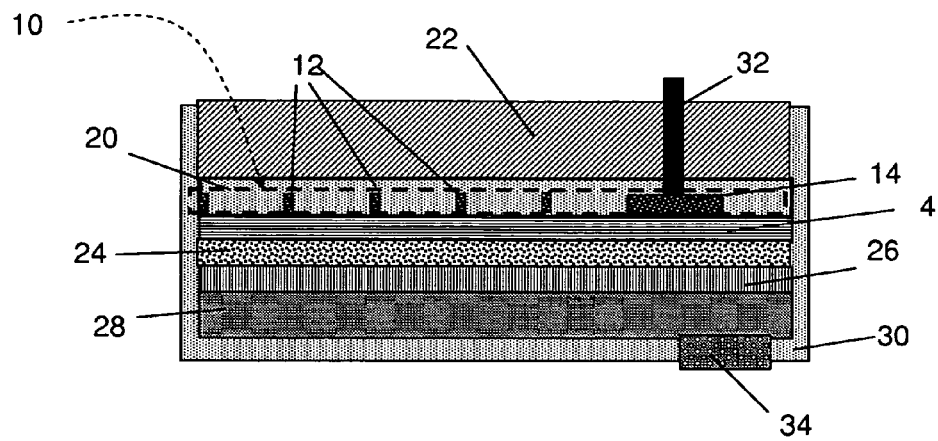
FIG. 2 shows an electro-optical device according to the first aspect of the invention.

FIG. 2 shows an embodiment of an electro-optical product according to the first aspect of the present invention.

The electro-optical device shown comprises a first electrode 10, a second electrode 26 and an electro-optical layer 24. The electro-optical layer 24 is arranged between the first and the second electrode 10, 26. The first electrode 10 is an electrode as described with reference to FIG. 1, 1A, 1B. The electro-optical layer 24 is a layer that converts an electric current into photon radiation. A transparent electrically conductive layer 4 e.g. a layer of SnO2:F is applied between the first electrode 10 and the electro-optical layer 24. The transparent electrically conductive layer 4 serves both as local distribution layer for laterally distributing the current that is provided by the electrode 10 and as an electron injection layer for injecting electrons in the electro-optical layer 24. Alternatively the electro-optical layer 24 is a layer that converts photon radiation into an electric current. Layer 24 can also be a stack of organic or inorganic or combinations thereof materials which are opto-electric active. Some of the organic and or inorganic layers might also be doped. In still another embodiment the electro-optic layer may have an optical property, for example transmission or reflectivity, which is dependent on a voltage applied over the electrodes 10, 26. Electro-optical layers having one of these functions are as such well known in the art. The electro-optical layer 24 may comprise a plurality of sub-layers.

In the embodiment shown, the electro-optical device is provided with one or more insulating layers 20, 22 at, at least the side of the first electrode 10 and with at least one electric feedthrough 32 that extends through the one or more insulating layers 20, 22 to at least one or more contact fields 14.

In the embodiment shown the one or more insulating layers includes at least a barrier layer 20. The barrier layer 20 counteracts transport of water and oxygen to the inside, which is of particular importance for organic light emitting products. The one or more insulating layers additionally include a substrate 22.

The device can further be provided with a hole-injection layer which can act as electrode 26, e.g. a PEDOT layer.

At the side of the second electrode 26 the electro-optical device is provided with a metal substrate 28. The metal substrate 28 functions as a mechanical support for the device and as a conductive plane. The metal substrate further has a barrier function. The metal substrate may be fabricated by electroplating. Element 30 denotes a barrier layer that may comprise a stack of sublayers of mutually different ceramic materials, for example the materials silicon oxide and silicon nitride. Element 30 is optional for the situation where the side protection is required. It might also be a protecting layer for mechanical protection. This protection layer might also be combined with a barrier layer. E.g. if the protection layer is organic it might be combined with the stack of ceramic materials. FIG. 2 further shows a sticker 34 that was applied before application of the barrier layer 30. After removal of the sticker 34*a* contact is available at the metal substrate 28.

Figure 2A:
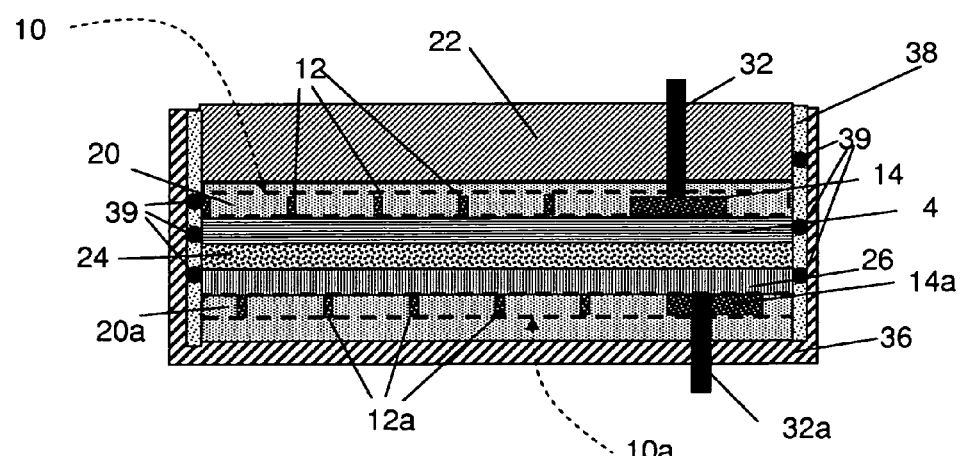
FIG. 2A shows an alternative embodiment of an electro-optical device according to the first aspect of the invention.

FIG. 2A shows an alternative embodiment. Therein the metal substrate 28 is replaced by an electrode structure 10*a*, similar to the electrode structure 10 described with reference to FIGS. 1, 1A and 1B. Parts corresponding to those of the electrode 10 the elements 32 connected therewith, and the barrier layer 20 have the same reference numeral provided with a suffix a. In this embodiment the hole-injection layer 26 further functions as a local distribution layer for laterally distributing the current provided by the electrode structure 10.

In the embodiment shown in FIG. 2A the electrode structure 10*a* is covered with a further barrier layer 20*a*. Furthermore the device is embedded in a covering formed by a metal foil 36 attached thereto with an electrically insulating adhesive 38. The insulating adhesive 38 is provided with getter particles 39. A contact element 14*a* is electrically coupled via a feedthrough 32*a*.

Some devices may be insensitive to atmospheric influences, or may be used in an inert atmosphere. In that case barrier layers may be omitted and also a feedthrough to a contact element may be superfluous in cases where the contact element is directly accessible from the outside.

With reference to FIG. 3A to 3I a method is described to manufacture an electro-optic device according to the first aspect of the present invention.

In a first step (shown in FIG. 3A), a metal foil 2 is provided, e.g. an aluminum foil, e.g. having a thickness in the range of 20 to 200 µm, e.g. with a thickness of 100 µm. If necessary, the foil may be cleaned for example by contact with (electrostatic) tacky rolls, by wet-chemical cleaning or by plasma treatment. Part a and b of FIG. 3A respectively show a cross-section and a top-view of the foil 2.

In a second step (shown in FIG. 3B), a transparent electrically conductive layer 4 is applied at a main surface of the metal foil 2. In the present embodiment a transparent electrically conductive layer of SnO2:F is applied by APCVD at a temperature of 550° C. The applied layer 4 typically has a thickness in the range of 20-600 nm.

FIG. 3C shows a third step wherein an electrode 10 is applied comprising an electrically conductive structure extending in a plane. Here the plane is defined by the surface of the transparent electrically conductive layer 4 at the foil or by the surface of the foil 2 itself in case a transparent electrically conductive layer is absent. Part a and b of FIG. 3C respectively show a cross-section and a top-view of the foil. The cross-section is taken according to C-C in part b.

Typically the electrode 10 is printed as this allows a rapid and contactless application of the electrically conductive material forming the electrode. In particular the electrode 10 is applied by printing a silver paste. However, other materials having a good conductivity, such as cupper or aluminum are suitable as well. Alternatively the electrode 10 may be applied by electroplating in combination with a resist process, as was shown in FIGS. 1, 1A and 1B. The electrode 10 comprises a structure formed by a grid of elongated elements 12 with length L and a width dimension D in said plane. The electrode 10 further comprises a plurality of contactfields 14 having an inscribed circle with a radius of at least 2D and a circumscribed circle with a radius of at most three times L. The area occupied by the contactfields 14 is at most 20% of the area occupied by the grid of elongated elements 12.

In a fourth step shown in FIG. 3D a barrier layer 20 is applied over the electrode 10. The barrier layer 20 may comprise a plurality of sub-layers of different inorganic materials that alternate each other. Alternatively the barrier layer 20 may comprise sub-layers of an inorganic material and of an organic material that alternate each other. In this embodiment a barrier layer is applied that subsequently comprises a silicon-nitride layer, a silicon-oxide layer, a silicon-nitride layer, a silicon-oxide layer and a silicon-nitride layer. This has the advantage that all sub-layers of the barrier layer can be applied by the same technology.

In a fifth step shown in FIG. 3E the barrier layer 20 is covered with an organic support layer 22, also denoted as substrate, e.g. having a thickness in the range of 20 to 50 μm. The organic support layer 22, e.g. a layer of polyimide may be applied by spin-coating for example. Alternatively an organic layer 22 may be applied by lamination to the barrier layer 20. This allows for a relatively fast procedure. However, glue, pressure, temperature and speed should be optimized to avoid bubbles in glue layer and cracking of $SnO_2$:F.

Figure 3F:
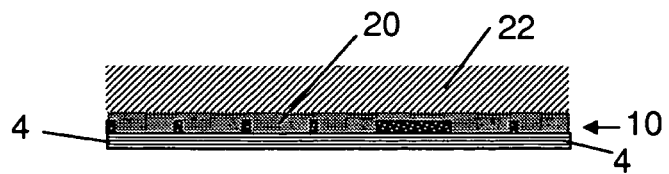

In a sixth step, shown in FIG. 3F, after application of the organic support layer 22, the metal foil 10 provided in the first step is removed. In this embodiment the metal foil 10 was removed by etching with an etchant, in this case a 5% solution of NaOH in water at a temperature of about 60° C. for 15-16 min. Subsequent to etching the semi-finished product so obtained was neutralized in a $H_3PO_4$ solution and rinsed in demineralised water.

Figure 3G:
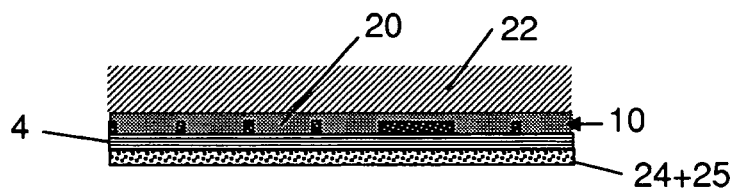

In a seventh step, shown in FIG. 3G, a conductive polymer layer 24, such as a PEDOT-layer was applied for example by spin coating. If this polymer layer has a sufficiently high conductivity, the second step, wherein the transparent conductive layer 4 is applied may be skipped. The conductive polymer layer 24 typically has a thickness in the order of about 100 nm. Subsequent thereto a light-emitting layer 25 having a thickness of about 80 nm was applied also by spin coating.

Figure 3H:
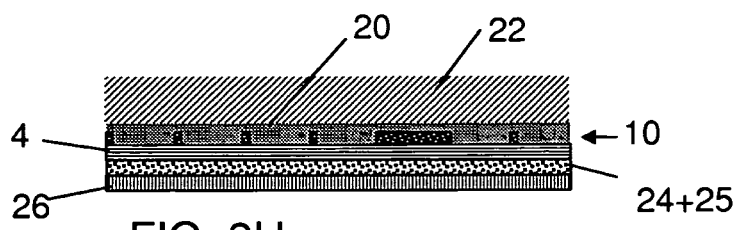

FIG. 3H shows an eighth step wherein a cathode 26 was deposited by thermal evaporation in this case. The deposited included deposition of a barium layer of about 5 nm at the light-emitting polymer layer and an aluminium layer of about 100 to 400 nm at the barium layer. Alternatively a transparent cathode may be applied, for example comprising a very thin layers of a metal, e.g. Ba, Al or Ag, e.g. together with a transparent conductive oxide layer and a dielectric.

Figure 3I:
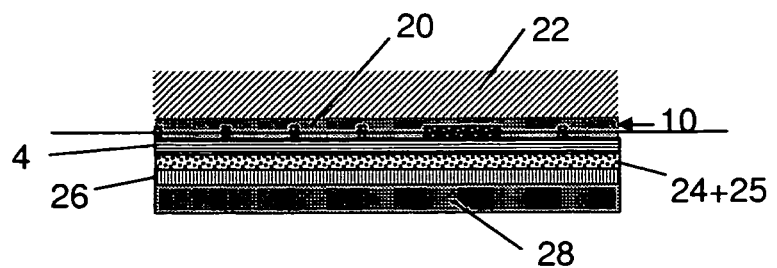

FIG. 3I shows a ninth step wherein the cathode 26 is covered by a metal layer 28. Various options are possible for this ninth step. In an embodiment the metal layer is applied by applying a relatively thin layer of aluminum to the cathode layer 26 by electroplating with an ionic liquid as described in European patent application 09158618.0 (P87649EP00) filed by the same Applicant. Alternatively a metal foil may be adhered to the cathode, using an electrically conductive adhesive.

If it is desired that the device is transparent at the side of the cathode 26, then it is alternatively possible to adhere a barrier foil provided with an electrically conductive structure to the cathode, for example a foil as prepared in step 3F. In that case it is not necessary that the layer 4 is transparent.

The first to the ninth step used for manufacturing the semifinished product of FIG. 3I may be carried out in a roll to roll process. The semifinished product obtained with this process may for example be a sheet having a width for example in the range of 10 cm to 2 m and a length in a range of 1 m to a few km. The sheet may be stored on a roll. In case the semifinished product comprises components sensitive for atmospheric substances, such as moisture and oxygen, it may be protected against side-leakage by taking care that the barrier structure 10 and the layer 28 together fully encapsulate those components. Alternatively however, the semifinished product may be stored in a protective atmosphere.

In a tenth step parts having a desired shape and size are separated from the semifinished product obtained in the ninth step. Parts may be separated by laser cutting or by punching for example.

Figure 4A:
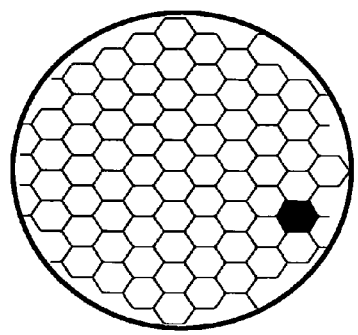
FIG. 4A to 4C show a tenth to a twelfth step of a method according to the second aspect of the invention.

FIG. 1 shows an example where a circular part is separated from the semifinished product. FIG. 4A shows the corresponding separated part. However, the separated part may have any shape and size as long as the separated part comprises at least one contact field 14.

Figure 4B:
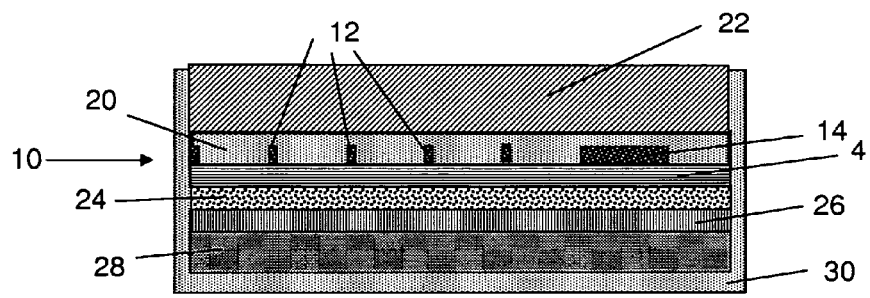
Figure 4C:
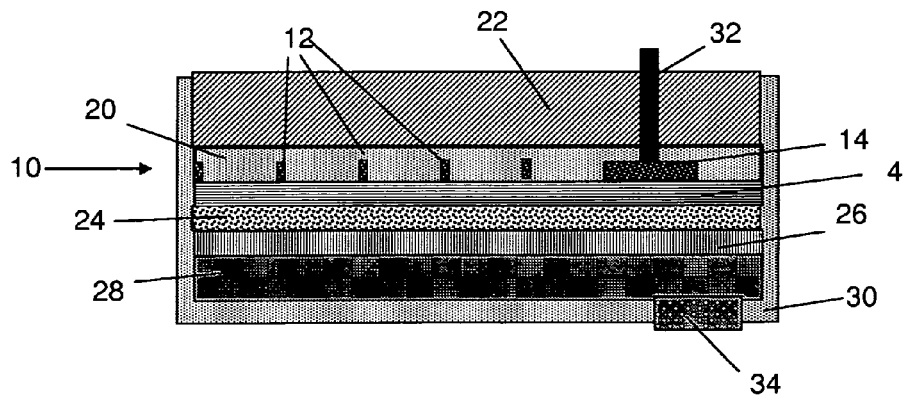

In an eleventh step (Shown in FIG. 4B) a barrier layer 30 is applied at the sides that became exposed by separating the product. The barrier layer 30 may comprise a stack of sub-layers of mutually different ceramic materials, for example the materials silicon oxide and silicon nitride. Optionally the side of the product having the cathode 26 may also be provided with a barrier layer 30, but this is not strictly necessary as this side is already protected by the metal foil 28. In that case a sticker 34 (see FIG. 4C) may be applied at the metal foil 28 before applying the barrier layer 30. After application of the barrier layer 30 the sticker 34 can be removed therewith leaving an electric contact at the metal foil 28.

The barrier layer 30 may be applied by a low temperature PECVD process and the barrier layer 30 so obtained may subsequently be mechanically protected by applying, e.g. by dip-coating, an organic layer, such as polyimide or PEN thereon.

In a twelfth step (Shown in FIG. 4C) at least one electric feed-through 32 is applied that extends through the organic support layer 22 and the barrier layer 20 to a contact field 14 of the electrically conductive structure 10. The presence of the at least one contactfield 14 in the electrically conductive structure 10 makes it possible to easily obtain an reliable electric contact between the electrically conductive structure 10 and an external electric conductor. If desired more than one contactfield 14 in the electrically conductive structure 10 may be connected to an external electric conductor via such an electric feed-through.

In the embodiment shown the contact fields 14 replace openings 11 in the grid of elongated elements 12. This has the advantage that a very good electrical connection between the contact fields 14 and the grid of elongated elements 12 is achieved. Alternatively however other relative positions of the contact fields 14 within the grid of elongated elements 12 are possible, as shown in FIG. 5A or 5B. Also the contact fields 14 do not need to have the same size as the openings but may be smaller (FIG. 5C) or larger (FIG. 5D). In the example of FIG. 5C, the inscribed circle has a radius of 0.45 mm, which is about nine times larger than the width D (50 μm) of the elongated elements. The circumscribed circle has a radius of 0.5 mm, which is about 0.5 times the length L (1 mm) of the elongated elements. In the example of FIG. 5D the inscribed circle has a radius of 1 mm, which is about 20 times larger than the width D (50 μm) of the elongated elements. In FIG. 5D the circumscribed circle has a radius of 1.1 mm, which is about 1.1 times the length L (1 mm) of the elongated elements.

Figure 6A:
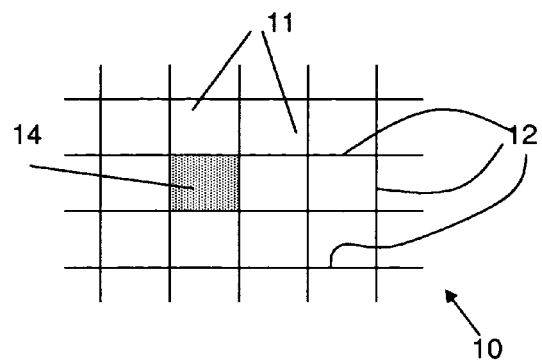
FIG. 6A to 6C shows further alternative embodiments for an electrode of an electro-optical device according to the first aspect of the invention,
FIG. 7 schematically shows an apparatus according to the third aspect of the invention.
Figure 6B:
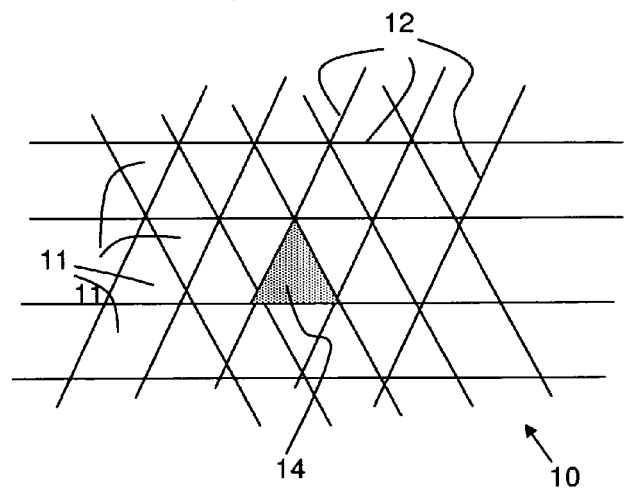
Figure 6C:
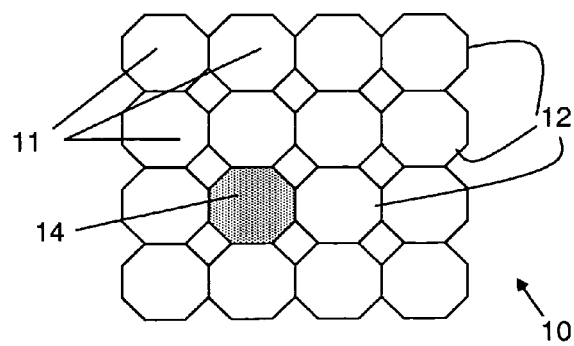

It is not necessary that the grid of elongated elements 12 is a hexagonal grid. For example a rectangular grid (FIG. 6A), a triangular grid (FIG. 6B) or an octagonal grid (FIG. 6C) may be used. It is not necessary that the grid is fully regular. Alternatively the grid may be irregular e.g. formed by a combination of elongated elements of different size. However for an OLED it may be desirable that the grid is sufficiently regular to result in a current distribution that results in an intensity distribution that appears homogeneous to an observer.

Various methods are applicable to provide for a substrate with an electrically conductive structure according to the present invention. As indicated above, according to one such method the electrically conductive structure is printed and according to another method the electrically conductive structure is applied by electroplating. According to again another method the electrically conductive structure may be applied by selective etching of a metal foil, so that the remaining material of the metal foil after the selective etching process forms the electrically conductive structure, as is described for example in European patent application 08173040 (P86830EP00), earlier filed by the same Applicant. The electrically conductive structure so obtained may be embedded in a barrier layer as is described for example in European patent application 09167416.8 (P88200EP00), also earlier filed by the same Applicant.

Figure 7:
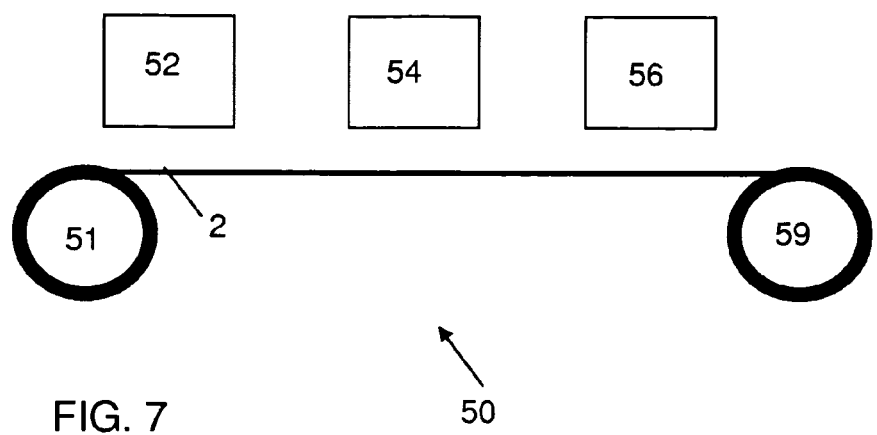

FIG. 7 schematically shows an apparatus 50 for manufacturing an electro-optical device. The apparatus 50 comprising a device 52 for manufacturing an electrode 10 for an electro-optical device comprising a facility, e.g. a printing facility that is controlled to apply an electrically conductive structure extending in a plane at a surface of a carrier 2. The structure applied by the printing facility, for example the structure of FIGS. 1, 1A and 1B, comprises a grid of elongated elements 12 with length L and a width dimension D in said plane. The structure further comprises one or more contactfields 14 having an inscribed circle 14$i$ with a radius of at least 2D and a circumscribed circle 14$e$ with a radius of at most three times L. The area occupied by the contactfields 14 is at most 20% of the area occupied by the grid of elongated elements 12. The apparatus 50 further comprises a device 54 for applying an electro-optical layer 24 and a device 56 for applying a second electrode 26 (see FIG. 2).

In practice the apparatus 50 may comprise further facilities for applying other layers, depending on the type of electro-optical device to be manufactured. For example, in case the electro-optical device to be manufactured is an OLED, facilities may be present to apply a hole injection layer, barrier layers etc. The various facilities may require special atmospheric conditions for operation. E.g. for applying inorganic layers operation an evacuated atmosphere may be required. In this case the semifinished product to be processed according to such special atmospheric conditions may be placed batchwise in a chamber having the particular facility and offering the required special atmospheric conditions during the process. Alternatively, if a continuous process flow is required, as in a roll to roll process, the semifinished product to be processed may be transported in and out the chamber having the particular facility and offering the required special atmospheric conditions via atmosphere decoupling slots as described in European patent application 09169668.2 (P88847EP00), earlier filed by the same Applicant. In the embodiment shown the substrate 2 to be processed is guided along the various facilities by a transporting facility comprising at least an unwind roll 51 and a rewind roll 59.

While the invention has been illustrated and described in detail in the drawings and foregoing description, such illustration and description are to be considered illustrative and exemplary and not restrictive; the invention is not limited to the disclosed embodiments.

Other variations to the disclosed embodiments can be understood and effected by those skilled in the art in practicing the claimed invention, from a study of the drawings, the disclosure and the appended claims. In the claims the word "comprising" does not exclude other elements or steps, and the indefinite article "a" or "an" does not exclude a plurality. A single processor or other unit may fulfill the functions of several items recited in the claims. The mere fact that certain measures are recited in mutually different claims does not indicate that a combination of these measures cannot be used to advantage. Any reference signs in the claims should not be construed as limiting the scope.

The invention claimed is:

1. An electro-optical device comprising a first electrode and a second electrode and an electro-optical layer, wherein the electro-optical layer is arranged between the first and the second electrode, wherein at least the first electrode comprises an electrically conductive structure extending in a plane, the structure comprising a grid of elongated elements with length L and a width dimension D in said plane, the electrically conductive structure further comprising one or more contact fields for connection with an external electric conductor, each of said one or more contact fields partly or fully occupying one or more openings in the grid, said one or more contact fields having an inscribed circle with a radius of at least 2D and a circumscribed circle with a radius of at most three times L and wherein the area occupied by the contact fields is at most 20% of the area occupied by the grid of elongated elements, wherein said electrically conductive structure including said grid of elongated elements and said one or more contact fields are of an electrically conductive material and wherein said one or more contact fields are electrically connected to said grid.

2. An electro-optical device according to claim 1, wherein both the first and the second electrode comprise said electrically conductive structure.

3. An electro-optical device according to claim 1, provided with a covering surrounding the device and a getter material arranged inside the covering.

4. An electro-optical device according to claim 1, provided with one or more insulating layers at at least the side of the first electrode and with at least one electric feed-through that extends through the one or more insulating layers to at least one of the one or more contact fields.

5. An electro-optical device according to claim 4, wherein the one or more insulating layers include a barrier layer.

6. An electro-optical device according to claim 4, wherein the one or more insulating layers include a substrate.

7. An electro-optical device according to claim 1, provided with a metal substrate at a side of the second electrode.

8. Apparatus for manufacturing an electro-optical device, the apparatus comprising a device for manufacturing an electrode for an electro-optical device comprising a facility that is controlled to apply an electrically conductive structure extending in a plane at a surface of a carrier, the structure comprising a grid of elongated elements with length L and a width dimension D in said plane, the structure further comprising one or more contact fields for connection with an external electric conductor, each of said one or more contact fields partly or fully occupying one or more openings in the grid, said one or more contact fields having an inscribed circle with a radius of at least 2D and an circumscribed circle with a radius of at most three times L and wherein the area occupied by the contact fields is at most 20% of the area occupied by the grid of elongated elements the apparatus further comprising a device for applying an electro-optical layer and a device for applying a second electrode, wherein said electrically conductive structure including said grid of elongated elements and said one or more contact fields are of an electrically conductive material and wherein said one or more contact fields are electrically connected to said grid.

9. An electro-optical device according to claim 2, provided with a metal substrate at a side of the second electrode.

10. An electro-optical device according to claim 3, provided with a metal substrate at a side of the second electrode.

11. An electro-optical device according to claim 4, provided with a metal substrate at a side of the second electrode.

12. An electro-optical device according to claim 5, provided with a metal substrate at a side of the second electrode.

13. An electro-optical device according to claim 6, provided with a metal substrate at a side of the second electrode.

* * * * *